(12) United States Patent
Santurkar et al.

(10) Patent No.: US 7,443,193 B1
(45) Date of Patent: Oct. 28, 2008

(54) TECHNIQUES FOR PROVIDING CALIBRATED PARALLEL ON-CHIP TERMINATION IMPEDANCE

(75) Inventors: Vikram Santurkar, Fremont, CA (US); Hyun Yi, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/618,804

(22) Filed: Dec. 30, 2006

(51) Int. Cl.
   *H03K 17/16* (2006.01)
(52) U.S. Cl. .............................. 326/30; 326/86; 326/87
(58) Field of Classification Search .................. 326/30; 327/108
   See application file for complete search history.

(56) References Cited

U.S. PATENT DOCUMENTS

| | | | |
|---|---|---|---|
| 5,559,448 A | 9/1996 | Koenig | |
| 5,910,713 A * | 6/1999 | Nishi et al. | 315/308 |
| 5,955,911 A | 9/1999 | Drost et al. | |
| 6,064,224 A | 5/2000 | Esch et al. | |
| 6,118,310 A | 9/2000 | Esch et al. | |
| 6,445,245 B1 | 9/2002 | Schultz et al. | |
| 6,489,837 B2 | 12/2002 | Schultz et al. | |
| 6,586,964 B1 | 7/2003 | Kent et al. | |
| 6,590,413 B1 | 7/2003 | Yang | |
| 6,603,329 B1 | 8/2003 | Wang et al. | |
| 6,798,237 B1 | 9/2004 | Wang et al. | |
| 6,812,732 B1 | 11/2004 | Bui et al. | |
| 6,836,144 B1 | 12/2004 | Bui et al. | |
| 7,019,556 B2 * | 3/2006 | Yoo | 326/30 |
| 7,064,576 B1 * | 6/2006 | Maangat | 326/30 |
| 7,218,155 B1 | 5/2007 | Chang et al. | |
| 7,221,193 B1 | 5/2007 | Wang et al. | |
| 7,239,171 B1 | 7/2007 | Wang et al. | |
| 7,268,712 B1 * | 9/2007 | Sheen | 341/120 |
| 2004/0113653 A1 | 6/2004 | Lundberg | |
| 2004/0217774 A1 * | 11/2004 | Choe | 326/30 |
| 2005/0012533 A1 | 1/2005 | Aoyama et al. | |
| 2007/0236247 A1 | 10/2007 | Wang et al. | |
| 2008/0061818 A1 | 3/2008 | Santurkar et al. | |

OTHER PUBLICATIONS

U.S. Appl. No. 11/040,343, filed Jan. 20, 2005, Chang et al.
U.S. Appl. No. 11/040,048, filed Jan. 20, 2005, Wang et al.
U.S. Appl. No. 11/381,356, filed May 2, 2006, Wang et al.
U.S. Appl. No. 11/356,867, filed Feb. 18, 2006, Santurkar et al.
U.S. Appl. No. 11/466,451, filed Aug. 22, 2006, Santurkar et al.
U.S. Appl. No. 11/462,702, filed Aug. 5, 2006, Wang et al.

* cited by examiner

*Primary Examiner*—Rexford Barnie
*Assistant Examiner*—Jany Tran
(74) *Attorney, Agent, or Firm*—Steven J. Cahill

(57) ABSTRACT

Techniques are provided for calibrating parallel on-chip termination (OCT) impedance circuits. An on-chip termination (OCT) calibration circuit generates first calibration codes and second calibration codes. The first calibration codes control the conductive states of first transistors that are coupled in parallel between a supply voltage and a first terminal. The second calibration codes control the conductive states of second transistors that are coupled in parallel between the first terminal and ground. The OCT calibration circuit selects a first calibration code and a second calibration code and transmits the selected calibration codes to third and fourth transistors to control a parallel on-chip termination impedance at a pin.

23 Claims, 8 Drawing Sheets

US 7,443,193 B1

TECHNIQUES FOR PROVIDING CALIBRATED PARALLEL ON-CHIP TERMINATION IMPEDANCE

BACKGROUND OF THE INVENTION

The present invention relates to electronic circuits, and more particularly, to techniques for providing calibrated parallel on-chip termination impedance on integrated circuits.

Signal reflection can occur on transmission lines when there is a mismatch between the characteristic impedance of the transmission line and the impedance of the transmitter and/or receiver. The reflected signal can interfere with the transmitted signal, causing distortion and degrading signal integrity.

To solve this problem, transmission lines are resistively terminated by a matching impedance to minimize or eliminate signal reflection. Input/output (I/O) pins on an integrated circuit package are often terminated by coupling external termination resistors to the appropriate I/O pins. However, many integrated circuit packages require a large number of termination resistors, because they have a large number of I/O pins. Therefore, it is becoming more common to resistively terminate transmission lines using on-chip termination (OCT) circuits to reduce the number of external components and to conserve board area.

Un-calibrated on-chip termination circuits can have tolerances in the range of +/−30% of a nominal value. In order to improve the accuracy of an on-chip termination (OCT) circuit, a calibration circuit can be used to calibrate the on-chip termination circuit using an off-chip resistor as a reference value.

Many prior art calibration circuits calibrate series on-chip termination impedance for output buffers. However, these calibration circuits typically to do provide accurate parallel on-chip termination impedance for input buffers. In some application, a higher degree of accuracy is required for parallel termination impedance. Therefore, it would be desirable to provide techniques for calibrating parallel on-chip termination impedance circuits to provide more accurate impedance values.

BRIEF SUMMARY OF THE INVENTION

The present invention provides techniques for calibrating parallel on-chip termination (OCT) impedance circuits. An on-chip termination (OCT) calibration circuit generates first calibration codes and second calibration codes. The first calibration codes control the conductive states of first transistors that are coupled in parallel between a supply voltage and a first terminal. The second calibration codes control the conductive states of second transistors that are coupled in parallel between the first terminal and ground. The OCT calibration circuit selects a first calibration code and a second calibration code and transmits the selected calibration codes to third and fourth transistors to control a parallel on-chip termination impedance at a pin.

Other objects, features, and advantages of the present invention will become apparent upon consideration of the following detailed description and the accompanying drawings.

DETAILED DESCRIPTION OF THE INVENTION

Figure 1:
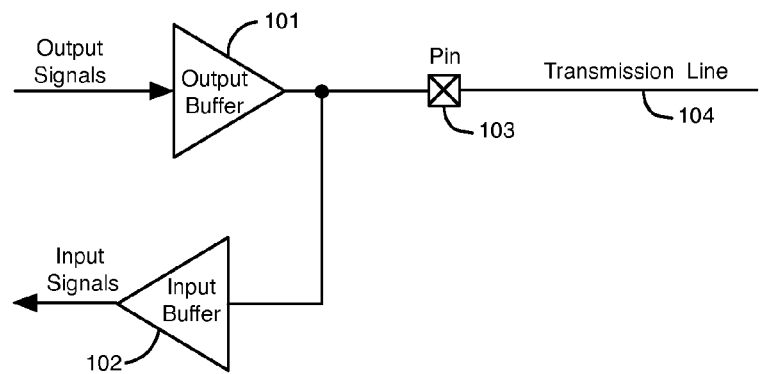
FIG. 1 illustrates an input buffer and an output buffer coupled to a transmission line through a pin, according to an embodiment of the present invention.

FIG. 1 illustrates an output buffer 101 and an input buffer 102 that are coupled to a pin 103 on an integrated circuit, according to an embodiment of the present invention. A transmission line 104 is coupled to pin 103. Output buffer 101 drives output signals to transmission line 104 through pin 103. Output buffer 101 contains P-channel and N-channel transistors that drive the output signals to transmission line 104. Examples of these transistors are shown in FIG. 2.

Figure 2:
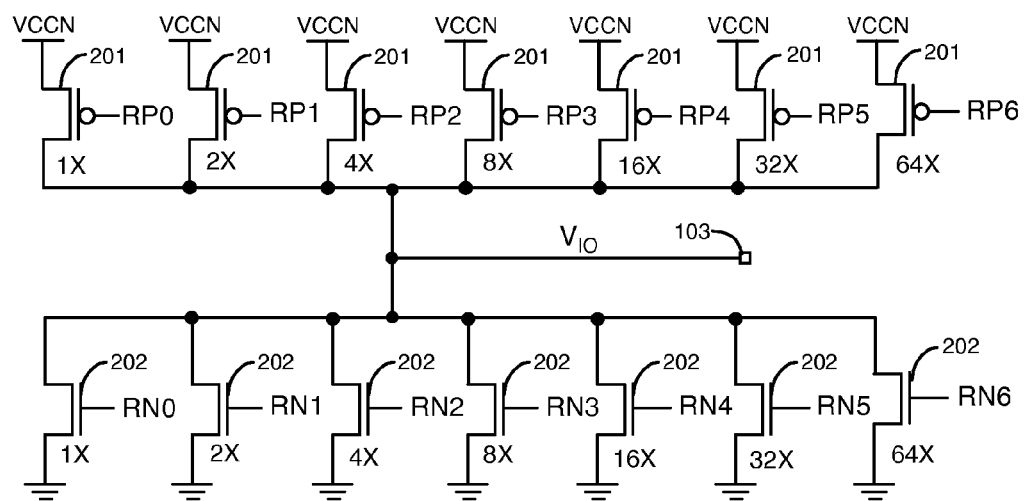
FIG. 2 illustrates an output buffer circuit having a set of parallel coupled P-channel transistors and a set of parallel coupled N-channel transistors, according to an embodiment of the present invention.

FIG. 2 illustrates 7 P-channel MOS field-effect transistors 201 that are coupled together in parallel, and 7 N-channel MOS field-effect transistors 202 that are coupled together in parallel in output buffer 101, according to an embodiment of the present invention. Transistors 201-202 have binary weighted width-to-length (W/L) channel ratios (e.g., 2×, 2×, 4×, 8×, 16×, 32×, 64×) as shown in FIG. 2. The drains of transistors 201 and 202 are coupled to pin 103. The voltage at pin 103 is $V_{IO}$.

Transistors 201 are turned on and off by signals RP0-RP6. Transistors 202 are turned on and off by signals RN0-RN6. Signals RP0-RP6 and RN0-RN6 are generated by driver circuitry (not shown). When output buffer 101 is being used to drive output data signals to transmission line 104, transistors 201 and 202 are selectively enabled by series calibration codes to provide series termination impedance to output buffer 101. The series calibration codes control which of the signals RP0-RP6 and RN0-RN6 are permitted to turn on the respective transistors 201-202 in response to output data signals.

Referring again to FIG. 1, input buffer 102 drives input signals from transmission line 104 to other circuitry on the integrated circuit through pin 103. Output signals cannot be driven to transmission line 104 at the same time that input signals are received from transmission line 104. Therefore, transistors 201 and 202 are not used to drive output signals when input buffer 102 is receiving input signals from transmission line 104.

When input buffer 102 drives input signals from transmission line 104, P-channel and N-channel calibration codes control the conductive states of transistors 201 and 202 in output buffer 101 to provide parallel termination impedance for input buffer 102. The P-channel calibration codes selectively turn on one or more of P-channel transistors 201. The N-channel calibration codes selectively turn on one or more of transistors 202. The P-channel and N-channel calibration codes turn on at least one of transistors 201 and at least one of transistors 202 at the same time to generate a Thevenin equivalent impedance (e.g., 50 ohms) that matches the characteristic impedance of transmission line 104. The parallel termination impedance provided by transistors 201 and 202 reduces or eliminates input signal reflection.

The P-channel and N-channel parallel calibration codes are generated by calibration circuitry and transmitted from the calibration circuitry to output buffer 101 (and typically to other output buffers on the same chip). An example of calibration circuitry that generates parallel calibration codes for controlling an on-chip parallel termination impedance is shown in FIG. 3.

Figure 3:
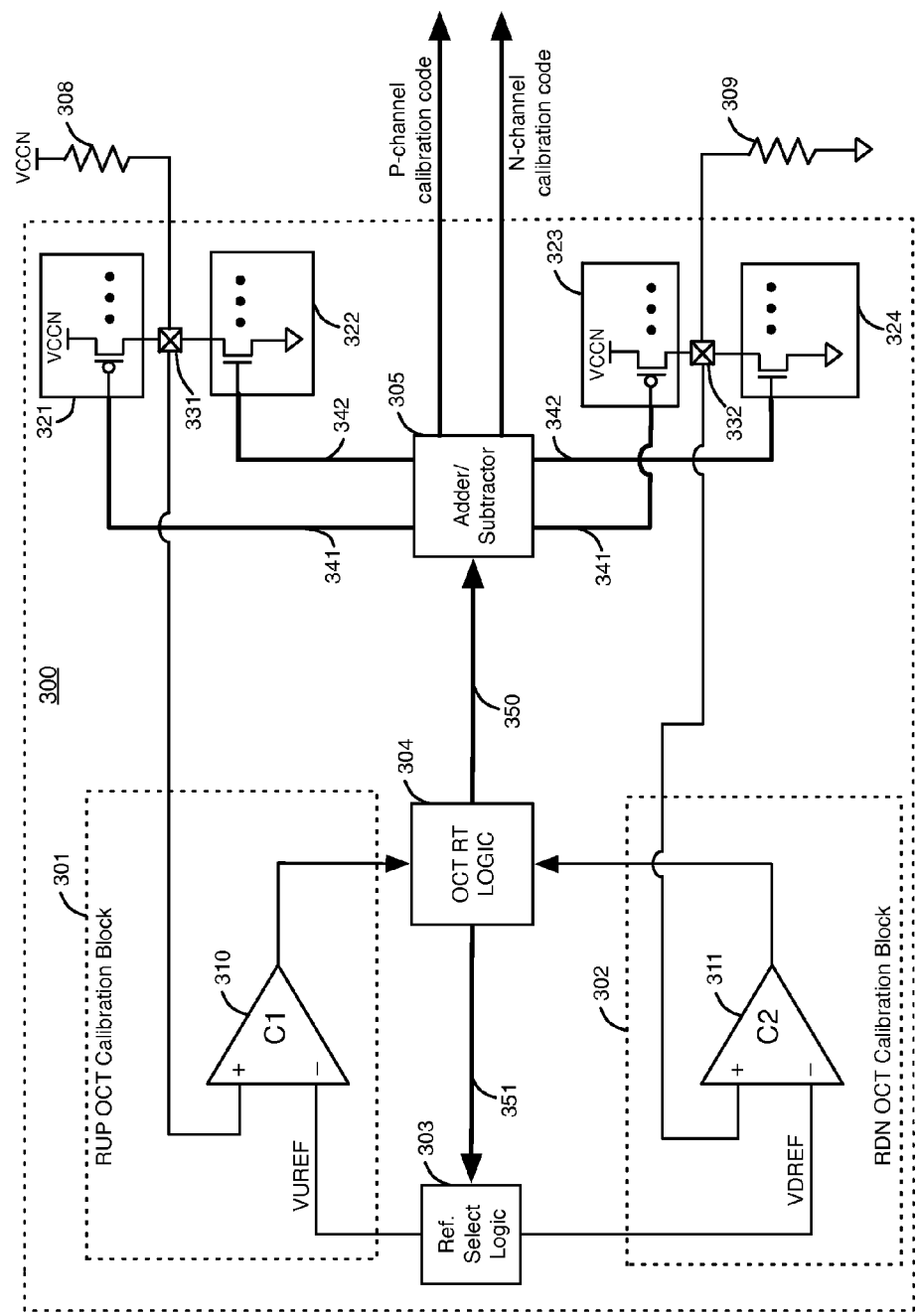
FIG. 3 illustrates on-chip termination (OCT) calibration circuitry that generates calibration codes for controlling parallel on-chip termination impedances, according to an embodiment of the present invention.

FIG. 3 illustrates calibration circuitry 300 that can generate calibration codes for controlling parallel on-chip termination impedances, according to an embodiment of the present invention. Calibration circuitry 300 includes RUP OCT calibration circuit block 301 and RDN OCT calibration circuit block 302. RUP OCT calibration circuit block 301 includes a comparator C1 310, and RDN OCT calibration circuit block 302 includes a comparator C2 311.

Calibration circuitry 300 also includes reference select logic 303, OCT parallel termination (Rt) logic 304, adder/subtractor circuit 305, external pins 331-332, P-channel transistor groups 321 and 323, and N-channel transistor groups 322 and 324. Each of P-channel transistor groups 321 and 323 includes a set of P-channel MOS (PMOS) field-effect transistors coupled together in parallel. Each of N-channel transistor groups 322 and 324 includes a set of N-channel MOS (NMOS) field-effect transistors coupled together in parallel.

The P-channel transistors in group 321 are coupled between supply voltage VCCN and pin 331. The P-channel transistors in group 323 are coupled between supply voltage VCCN and pin 332. The N-channel transistors in group 322 are coupled between pin 331 and ground. The N-channel transistors in group 324 are coupled between pin 332 and ground. Ground can represent zero volts or any other voltage value less than VCCN.

The transistor groups 321-324 can include any number of transistors. The number of transistors in each of the P-channel transistor groups 321 and 323 typically equals the number of P-channel transistors 201 in the output buffer, and the number of transistors in each of the N-channel transistor groups 322 and 324 typically equals the number of N-channel transistors 202 in the output buffer. The P-channel and N-channel transistors in groups 321-324 typically have binary weighted width-to-length channel ratios that match the width-to-length channel ratios of transistors 201 and 202 in output buffer 101.

Adder/subtractor circuit 305 generates two sets of parallel signals 341-342 that control the conductive states of the transistors in transistor groups 321-324. Signal sets 341-342 are also referred to herein as calibration codes 341-342. P-channel calibration code 341 controls the conductive states of the P-channel transistors in groups 321 and 323. N-channel calibration code 342 controls the conductive states of the N-channel transistors in groups 322 and 324.

Each of the calibration codes 341-342 contains enough bits (i.e., signals) to control the conductive states of each of the transistors in a corresponding transistor group. For example, if transistor group 321 has 8 parallel-coupled P-channel transistors, code 341 contains 8 signals. Each of the 8 signals controls the conductive state of one of the transistors in group 321.

Pin 331 is coupled to the drains of the transistors in transistor groups 321-322. Pin 331 is also coupled to a reference resistor 308 that is external to the integrated circuit (IC). Resistor 308 is coupled between supply voltage VCCN and pin 331. Transistor groups 321-322 and resistor 308 control the voltage at pin 331. When calibration is complete, calibration circuitry 300 selects a P-channel calibration code 341 and transmits the selected P-channel calibration code to one or more calibrated output buffers to control the impedance of P-channel transistors 201.

Comparator 310 compares the voltage at pin 331 with a reference voltage VUREF provided by reference voltage select logic circuit 303. The output signal of comparator 310 is a high or low digital value (i.e., 1 or 0). The output signal of comparator 310 is transmitted to a first input of OCT Parallel Termination (Rt) Logic 304.

Pin 332 is coupled to the drains of the transistors in transistor groups 323-324. Pin 332 is also coupled to a reference resistor 309 that is external to the IC. Resistor 309 is coupled between pin 332 and ground. Transistor groups 323-324 and resistor 309 control the voltage at pin 332. When calibration is complete, calibration circuitry 300 selects an N-channel calibration code 342 and transmits the selected N-channel calibration code to one or more calibrated output buffers to control the impedance of N-channel transistors 202.

The selected P-channel and N-channel calibration codes can cause transistors 201 and 202 to have a termination impedance that is within a tight tolerance range of the impedance of resistors 308 and 309. A user of an integrated circuit containing circuitry 300 can cause the termination impedance of output buffer 101 to closely match the characteristic impedance of transmission line 104 by selecting appropriate impedances for resistors 308 and 309.

Comparator 311 compares the voltage at pin 332 with a reference voltage VDREF provided by reference voltage select logic circuit 303. The output signal of comparator 311 is a high or low digital value (i.e., 1 or 0). The output signal of comparator 311 is transmitted to a second input of OCT Rt Logic 304.

OCT Rt logic 304 includes a state machine that outputs a control code 350 having a set of parallel signals for controlling adder/subtractor circuit 305. Control code 350 can have any suitable number of parallel signals, e.g., 4 signals/bits. Control code 350 controls whether adder/subtractor circuit 305 increments or decrements codes 341-342.

Logic 304 also outputs a set of reference voltage select signals 351. Signals 351 are transmitted to inputs of reference voltage select logic 303. Reference voltage select logic 303 can be, for example, two multiplexers that are coupled to receive a set of reference voltages.

Figure 4:
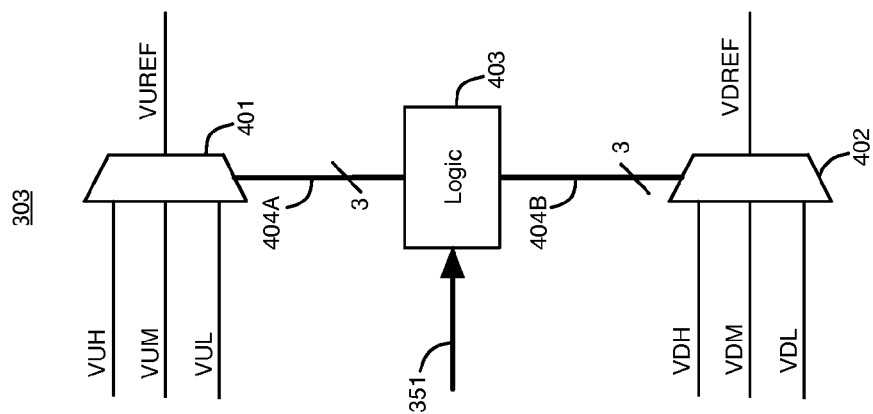
FIG. 4 illustrates an example implementation of the reference voltage select logic of FIG. 3, according to a particular embodiment of the present invention.

FIG. 4 illustrates an example of reference voltage select logic 303, according to a particular embodiment of the present invention. Reference voltage select logic 303 includes logic 403 and multiplexers 401 and 402. Logic 403 receives select signals 351 from OCT Rt logic 304. Logic 403 generates two sets of select signals, 404A and 404B in response to the states of select signals 351. Logic 403 can include, e.g., a decoder.

Multiplexer 401 receives three reference voltages, VUH, VUM, and VUL. Multiplexer 401 selects one of the reference voltages VUH, VUM, and VUL to transmit to its output and to the inverting (−) input of comparator 310 as reference voltage VUREF. The states of 3 select signals 404A from logic 403 determine which of the three reference voltages multiplexer 401 selects as VUREF.

Multiplexer 402 receives three reference voltages, VDH, VDM, and VDL. Multiplexer 402 selects one of the reference voltages VDH, VDM, and VDL to transmit to its output and to the inverting (−) input of comparator 311 as reference voltage VDREF. The states of 3 select signals 404B from logic 403 determine which of the three reference voltages multiplexer 402 selects as VDREF.

Figure 5:
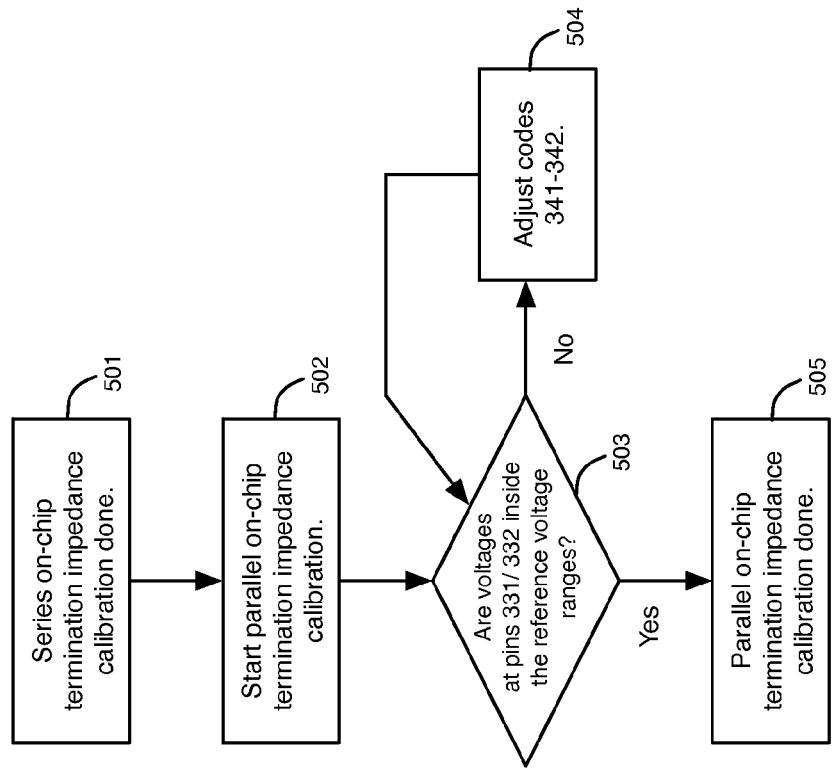
FIG. 5 is a flow chart illustrating an example of a parallel OCT calibration process that can be performed by a state machine in the OCT Rt logic of FIG. 3, according to an embodiment of the present invention.

FIG. 5 illustrates an example of a parallel OCT calibration process that can be performed by the state machine in OCT Rt logic 304, according to an embodiment of the present invention. The state machine can be implemented by programmable logic blocks in an FPGA or by hardwired circuitry.

After a process for calibrating the series on-chip termination impedance on the chip has been completed at step 501, the process of calibrating the parallel on-chip termination (OCT) impedance begins at step 502. At step 503, the state machine in logic 304 determines if the voltages at pins 331 and 332 are inside selected reference voltage ranges. The reference voltage ranges are determined by reference voltages VUH, VUM, VUL, VDH, VDM, and VDL.

Figure 6A:
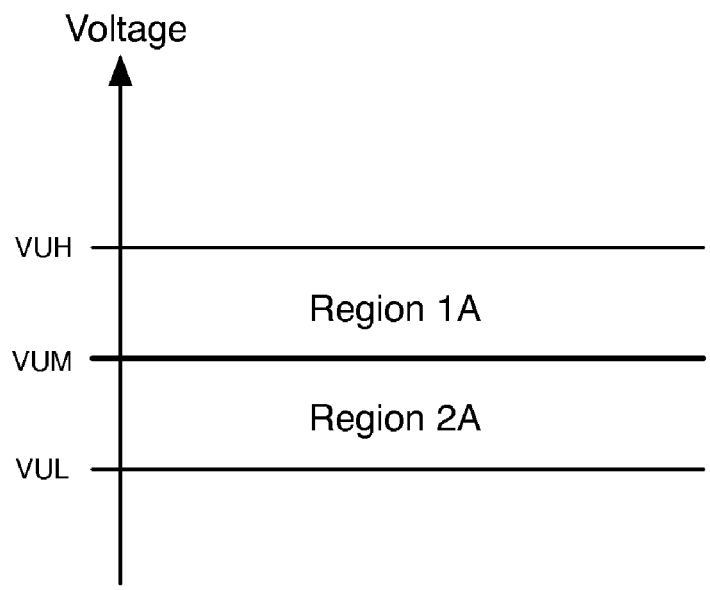
FIG. 6A is a graph illustrating voltage ranges used by the OCT calibration circuitry of FIG. 3 to calibrate parallel on-chip termination impedances, according to an embodiment of the present invention.
Figure 6A:
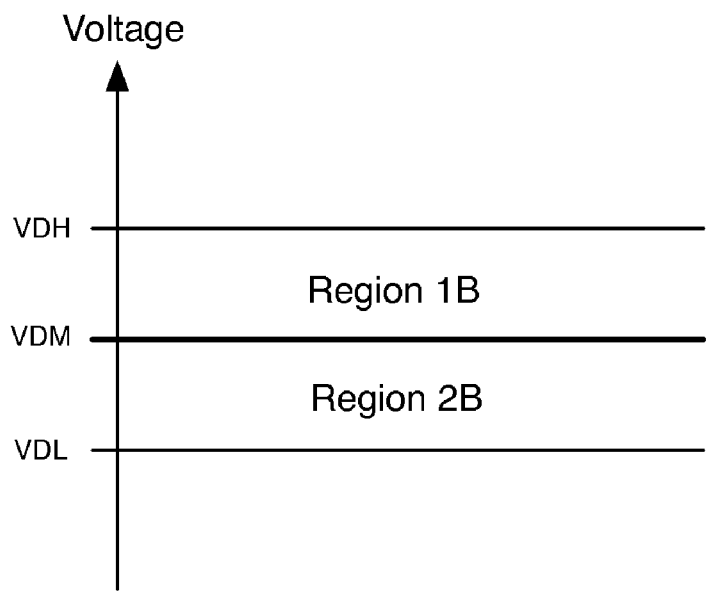

FIG. 6A illustrates the relative values of the 6 reference voltages, VUH, VUM, VUL, VDH, VDM, and VDL. The values of these 6 reference voltages can be selected as percentages of the supply voltage VCCN. The voltage range between VUH and VUM is defined as Region 1A. The voltage range between VUM and VUL is defined as Region 2A. The voltage range between VDH and VDM is defined as Region 1B. The voltage range between VDM and VDL is defined as Region 2B. Regions 1A, 1B, 2A, and 2B are shown in FIG. 6A.

Examples values for the 6 reference voltages are VUH=0.77*VCCN, VUM=0.75*VCCN, VUL=0.73*VCCN, VDH=0.27*VCCN, VDM=0.25*VCCN, and VDL=0.23*VCCN. VCCN can be, for example, 2.5 volts. These example values are provided for illustration and are not intended to limit the scope of the present invention.

At step 503, the state machine in logic 304 determines if the voltage at pin 331 is in Region 1A or 2A and if the voltage at pin 332 is in Region 1B or 2B. If one of the pin voltages is not in one of Regions 1A, 1B, 2A, or 2B at step 503, logic 304 causes circuit 305 to adjust codes 341-342 at step 504. Logic 304 continues to cause circuit 305 to adjust codes 341-342 until the voltage at pin 331 falls between VUH and VUL and the voltage at pin 332 falls between VDH and VDL. Once the pin voltages fall within these voltage ranges at step 503, the current values of parallel OCT calibration codes 341-342 are selected and transmitted to one or more calibrated output buffers to control the parallel on-chip termination impedance. The parallel OCT impedance process terminates at step 505.

Figure 6B:
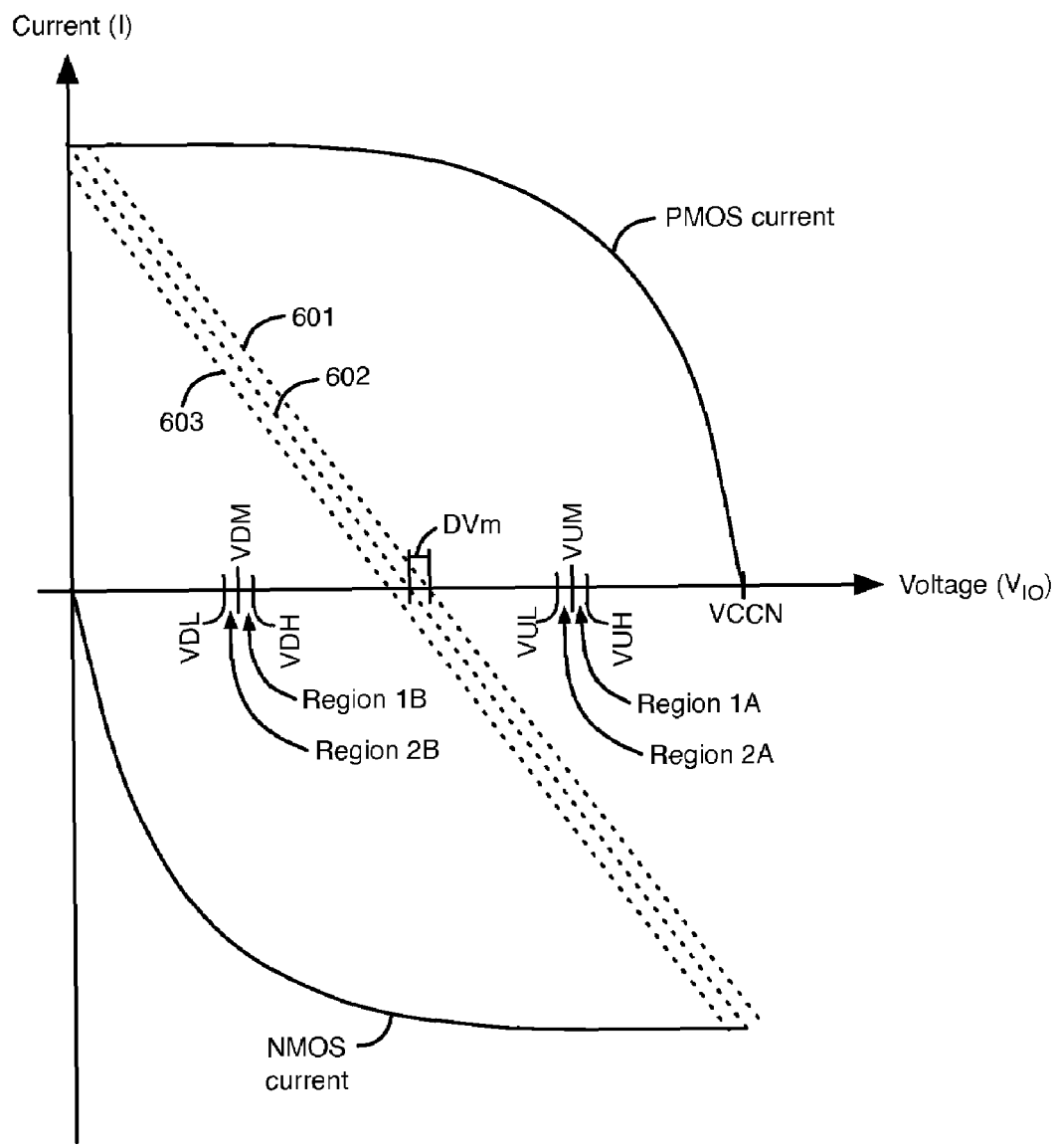
FIG. 6B is a graph that illustrates examples of the current and the impedance of parallel termination transistors in a calibrated output buffer, according to an embodiment of the present invention.

FIG. 6B is a current versus voltage (IV) graph that illustrates examples of the current and the impedance of parallel termination transistors in a calibrated output buffer, according to an embodiment of the present invention. The current through PMOS transistors 201 (PMOS current) and the current through NMOS transistors 202 (NMOS current) is illustrated in FIG. 6B over a range of voltage $V_{IO}$ at pin 103 from zero to supply voltage VCCN. Regions 1A, 2A, 1B, and 2B are labeled on the graph.

Also, the delta Vm specification is shown in FIG. 6B. Delta Vm (DVm) is defined as the percentage voltage offset of the parallel termination (Rt) graph from the ideal zero current crossing at half the supply voltage VCCN/2. Delta Vm=((2× Vm/VCCN)−1)×100%, where Vm equals the value of supply voltage VCCN at which the Rt graph intersects the current (I) axis (i.e., at I=0).

Parallel calibration codes 341-342 that generate voltages at pins 331 and 332 equal to VUH and VDH, respectively, can also generate a Thevenin equivalent impedance in a calibrated output buffer that approximately equals the slope of line 601 in FIG. 6B. Parallel calibration codes 341-342 that generate voltages at pins 331 and 332 equal to VUM and VDM, respectively, can also generate a Thevenin equivalent impedance (e.g., 50 ohms) in a calibrated output buffer that approximately equals the slope of line 602. Parallel calibration codes 341-342 that generate voltages at pins 331 and 332 equal to VUL and VDL, respectively, can also generate a Thevenin equivalent impedance in a calibrated output buffer that approximately equals the slope of line 603. In FIG. 6B, delta Vm (DVm) is shown as the voltage difference between lines 601 and 602 at zero current.

The state machine in logic 304 preferentially selects calibration codes 341-342 that cause the voltages at pins 331 and 332 to be in Regions 1A and 1B, or in Regions 2A and 2B. The calibration codes 341-342 that cause the voltages at pins 331 and 332 to be in Regions 1A and 1B, respectively, result in a net Thevenin equivalent impedance in the calibrated output buffer that is within a tight tolerance range. For example, if the difference between VUH and VUM equals 2% of supply voltage VCCN, and the difference between VDH and VDM equals 2% of supply voltage VCCN, then the Thevenin equivalent parallel termination impedance in the calibrated output buffer is within + or −10% of the impedance of resistors 308 and 309, when the pin voltages are in Regions 1A and 1B.

Similarly, the calibration codes 341-342 that cause the voltages at pins 331 and 332 to be in Regions 2A and 2B, respectively, result in a net Thevenin equivalent impedance in the calibrated output buffer that is within a tight tolerance range. For example, if the difference between VUM and VUL equals 2% of supply voltage VCCN, and the difference between VDM and VDL equals 2% of supply voltage VCCN, then the Thevenin equivalent parallel termination impedance in the calibrated output buffer is within + or −10% of the impedance of resistors 308 and 309, when the pin voltages are in Regions 2A and 2B.

The calibration codes 341-342 that cause the voltages at pins 331 and 332 to be in Regions 1A and 2B, respectively, result in a net Thevenin equivalent impedance in the calibrated output buffer that is within a wider tolerance range than the impedance caused by calibration codes that generate pin voltages in Regions 1A and 1B or in Regions 2A and 2B. Also, the calibration codes 341-342 that cause the voltages at pins 331 and 332 to be in Regions 2A and 1B, respectively, result in a net Thevenin equivalent impedance in the calibrated output buffer that is within a wider tolerance range than the impedance caused by calibration codes that generate pin voltages in Regions 1A and 1B or in Regions 2A and 2B.

Figure 7:
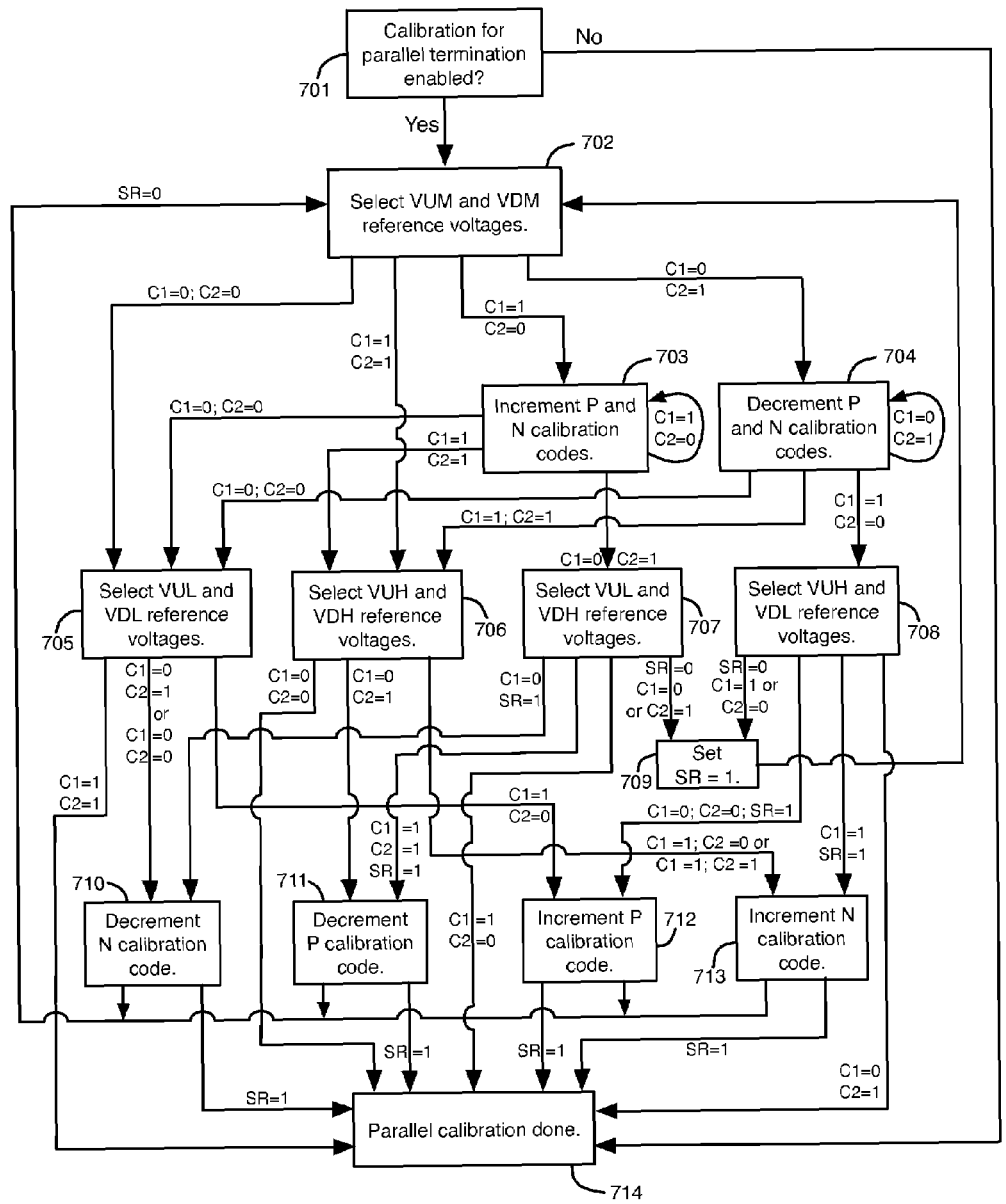
FIG. 7 is a flow chart illustrating a more detailed example of a parallel OCT calibration process that can be performed by a state machine in the OCT Rt logic of FIG. 3, according to another embodiment of the present invention.

FIG. 7 is a flow chart illustrating a more detailed example of a parallel OCT calibration process that can be performed by a state machine in OCT Rt logic 304, according to another embodiment of the present invention. The state machine initially sets the logic state of a state register SR to 0. After series OCT calibration is complete, the state machine in logic 304 determines if the parallel OCT calibration feature of the integrated circuit chip is enabled at step 701. If the parallel OCT calibration feature is not enabled, the parallel OCT calibration process is not performed. If parallel OCT calibration is enabled, the state machine sets select signals 351 at step 702 so that logic 303 transmits reference voltages VUM and VDM to comparators 310 and 311, respectively.

In the flow chart of FIG. 7, the output signal of comparator 310 is labeled C1, and the output signal of comparator 311 is labeled C2. In FIG. 7, C1=1 refers to at logic high at the output of comparator 310, C1=0 refers to a logic low at the output of comparator 310, C2=1 refers to a logic high at the output of comparator 311, and C2=0 refers to a logic low at the output of comparator 311.

If the output signals of comparators 310 and 311 are both logic lows (C1=0 and C2=0) after step 702, then the state machine causes select logic 303 to transmit reference voltages VUL and VDL to comparators 310 and 311, respectively, at step 705. If the output signals of comparators 310 and 311 are both logic highs (C1=1 and C2=1) after step 705, then the parallel OCT calibration process ends at step 714. The voltage at pin 331 is in region 2A between VUM and VUL, and the voltage at pin 332 is in region 2B between VDM and VDL.

If C1=0 and C2=1 after step 705, or C1=0 and C2=0 after step 705, adder/subtractor circuit 305 decrements the binary value of N-channel calibration code 342 by one at step 710 to increase the impedance of the N-channel transistors in groups 322 and 324, thereby increasing the pin voltages. Decrementing code 342 causes the voltage at pin 331 to increase more than the voltage at pin 332 increases. Subsequently, the state machine returns to step 702, because the logic state of state register SR is 0.

If C1=1 and C2=0 after step 705, adder/subtractor circuit 305 increments the binary value of P-channel calibration code 341 by one at step 712 to decrease the impedance of the P-channel transistors in groups 321 and 323, thereby increasing the pin voltages. Drivers in transistor groups 321 and 323 invert signals from code 341 before they are transmitted to the gates of the P-channel transistors. Incrementing code 341 causes the voltage at pin 332 to increase more than the voltage at pin 331 increases. Subsequently, the state machine returns to step 702, because the logic state of state register SR equals 0.

If the output signals of comparators 310 and 311 are both logic highs (C1=1 and C2=1) after step 702, the state machine causes select logic 303 to transmit reference voltages VUH and VDH to comparators 310 and 311, respectively, at step 706. If the output signals of comparators 310 and 311 are both logic lows (C1=0 and C2=0) after step 706, the parallel OCT calibration process ends at step 714. The voltage at pin 331 is in region 1A between VUH and VUM, and the voltage at pin 332 is in region 1B between VDH and VDM.

If C1=0 and C2=1 after step 706, adder/subtractor circuit 305 decrements the binary value of P-channel calibration code 341 by one at step 711 to increase the impedance of the P-channel transistors in groups 321 and 323, thereby decreasing the pin voltages. Decrementing code 341 causes the voltage at pin 332 to decrease more than the voltage at pin 331 decreases. Subsequently, the state machine returns to step 702, because the logic state of state register SR equals 0.

If C1=1 and C2=0 after step 706, or C1=1 and C2=1 after step 706, adder/subtractor circuit 305 increments the binary value of N-channel calibration code 342 by one at step 713 to decrease the impedance of the N-channel transistors in groups 322 and 324, thereby decreasing the pin voltage. Incrementing code 342 causes the voltage at pin 331 to decrease more than the voltage at pin 332 decreases. Subsequently, the state machine returns to step 702, because the logic state of state register SR equals 0.

If C1=1 and C2=0 after step 702, adder/subtractor circuit 305 increments the binary value of each of the N-channel and the P-channel calibration codes 341-342 by one at step 703. Incrementing both of codes 341-342 causes the voltage difference between pins 331-332 to decrease. The state machine continues to repeat step 703 as long as C1=1 and C2=0. After step 703, the state machine proceeds to step 705 if C1=0 and C2=0, to step 706 if C1=1 and C2=1, or to step 707 if C1=0 and C2=1.

At step 707, the state machine in logic 304 causes logic 303 to transmit reference voltages VUL and VDH to comparators 310 and 311, respectively. If the state of register SR is zero and (C1=0 or C2=1) after step 707, the state of register SR is set to equal 1 at step 709. The state machine then returns to step 702 and causes logic 303 to select reference voltages VUM and VDM again.

If C1=1 and C2=0 after step 707, the parallel calibration process ends at step 714. The voltage at pin 331 is in region 2A between VUM and VUL, and the voltage at pin 332 is in region 1B between VDH and VDM.

If C1=1, C2=1, and SR=1 after step 707, the state machine decrements the binary value of P-channel calibration code 341 by one at step 711 to increase the impedance of the P-channel transistors in groups 321 and 323. Subsequently, the calibration process ends at step 714.

If C1=0 and SR=1 after step 707, the state machine decrements the binary value of the N-channel calibration code 342 by one at step 710 to increase the impedance of the N-channel transistors in groups 322 and 324. Subsequently, the calibration process ends at step 714.

If C1=0 and C2=1 after step 702, adder/subtractor circuit 305 decrements the binary value of each of the N-channel and the P-channel calibration codes 341-342 by one at step 704. Decrementing both of codes 341-342 causes the voltage difference between pins 331-332 to increase. The state machine continues to repeat step 704 as long as C1=0 and C2=1. After step 704, the state machine proceeds to step 705 if C1=0 and C2=0, to step 706 if C1=1 and C2=1, or to step 708 if C1=1 and C2=0.

At step 708, the state machine in logic 304 causes logic 303 to transmit reference voltages VUH and VDL to comparators 310 and 311, respectively. If the state of register SR is zero and (C1=1 or C2=0) after step 708, the state of register SR is set to equal 1 at step 709. The state machine then returns to step 702 and causes logic 303 to select reference voltages VUM and VDM again.

If C1=0 and C2=1 after step 708, the parallel calibration process ends at step 714. The voltage at pin 331 is in region 1A between VUH and VUM, and the voltage at pin 332 is in region 2B between VDM and VDL.

If C1=1 and SR=1 after step 708, the state machine increments the binary value of N-channel calibration code 342 by one at step 713 to decrease the impedance of the N-channel transistors in groups 322 and 324. Subsequently, the calibration process ends at step 714.

If C1=0, C2=0, and SR=1 after step 708, the state machine increments the binary value of P-channel calibration code 341 by one at step 712 to decrease the impedance of the P-channel transistors in groups 321 and 323. Subsequently, the calibration process ends at step 714.

At step 714, adder/subtractor circuit 305 transmits the current P-channel calibration code 341 and the current N-channel calibration code 342 to output buffer 101. The P-channel calibration code is used to turn on one or more of P-channel transistors 201. The N-channel calibration code is used to turn on one or more of N-channel transistors 202. As mentioned above, the impedances of resistors 308 and 309 can be selected to cause the termination impedance of output buffer 101 to closely match the characteristic impedance of transmission line 104. The P-channel and N-channel calibration codes can be transmitted to numerous other output buffers on the same integrated circuit chip to provide calibrated parallel on-chip termination impedance at numerous other pins.

Figure 8:
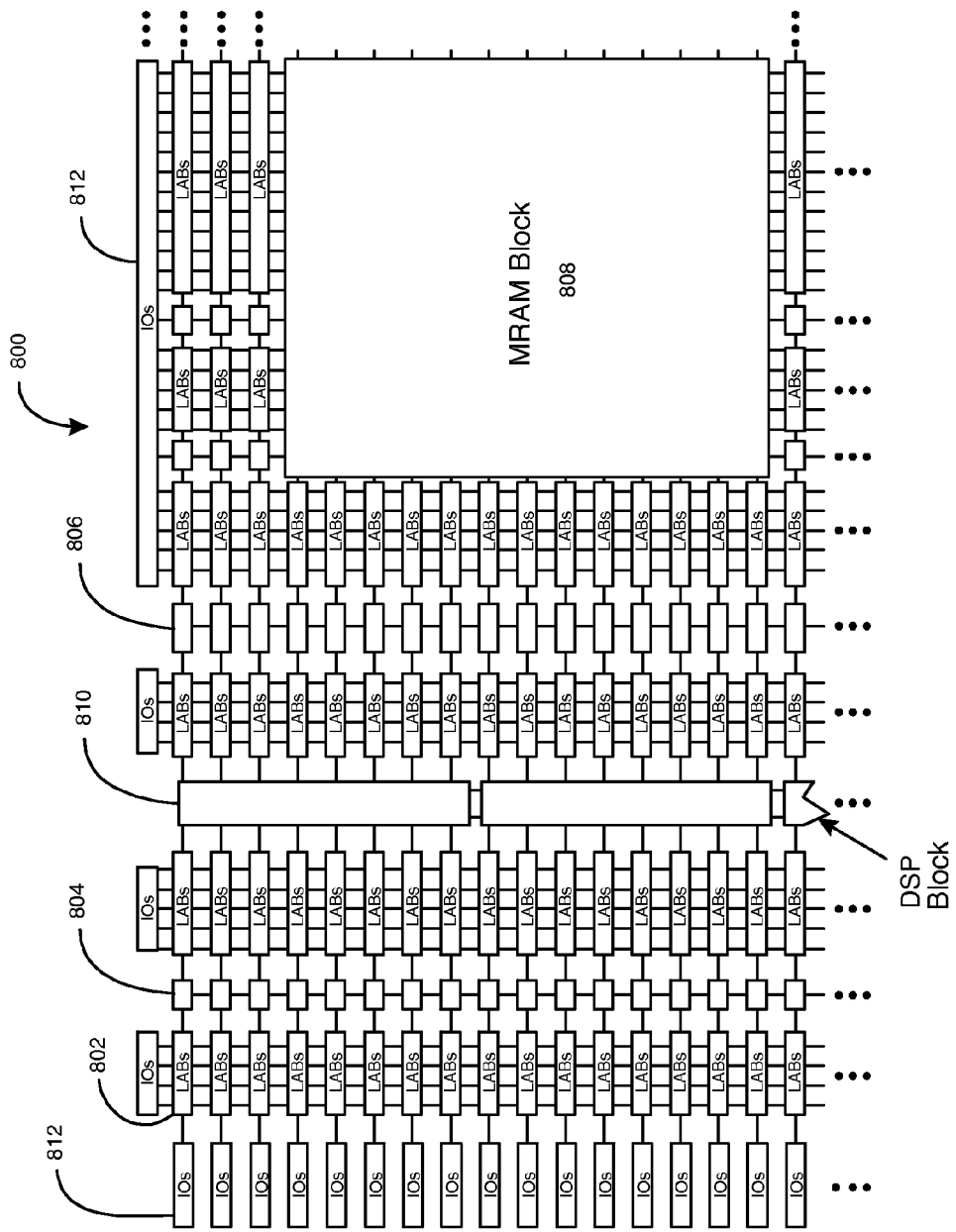
FIG. 8 is a simplified block diagram of a field programmable gate array (FPGA) that can embody the techniques of the present invention.

FIG. 8 is a simplified partial block diagram of an FPGA 800 that can include aspects of the present invention. FPGA 800 is merely one example of an integrated circuit that can include features of the present invention. It should be understood that embodiments of the present invention can be applied to numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including RAM blocks of varying sizes provided throughout the array. The RAM blocks include, for example, blocks 804, blocks 806, and block 808. These memory blocks can also include shift registers and FIFO buffers.

FPGA 800 further includes digital signal processing (DSP) blocks 810 that can implement, for example, multipliers with add or subtract features. IO blocks (IOs) 812 located, in this example, around the periphery of the chip support numerous single-ended and differential input/output standards. The IO blocks 812 contain IO buffers and are typically grouped into IO banks. It is to be understood that FPGA 800 is described herein for illustrative purposes only and that the present invention can be implemented in many different types of PLDs, FPGAs, and the like.

Figure 9:
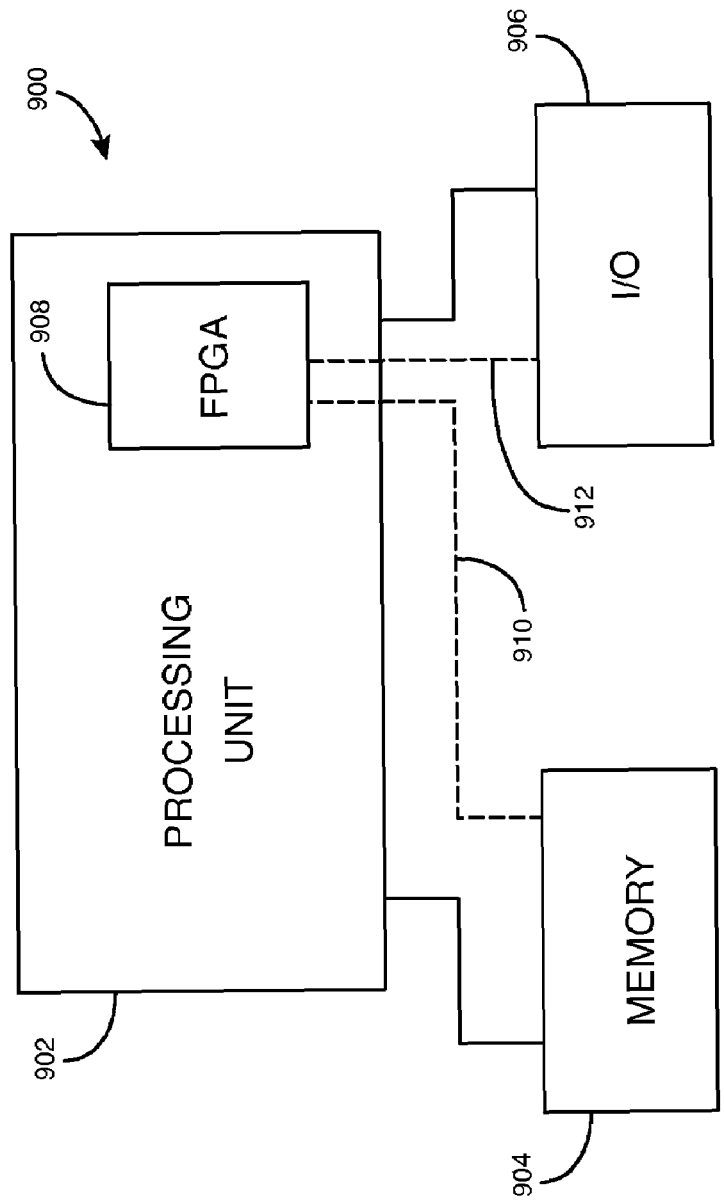
FIG. 9 is a block diagram of an electronic system that can implement embodiments of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904 and an I/O unit 906 interconnected together by one or more buses. According to this exemplary embodiment, an FPGA 908 is embedded in processing unit 902. FPGA 908 can serve many different purposes within the system in FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904 or receive and transmit data via I/O unit 906, or other similar function. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor, which can be reprogrammed as needed to handle a particular computing task. Alternately, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. It is not intended to be exhaustive or to limit the present invention to the precise form disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is intended that the scope of the present invention be limited not with this detailed description, but rather by the claims appended hereto.

The invention claimed is:

1. A parallel on-chip termination (OCT) calibration circuit comprising:
    first transistors coupled in parallel between a first terminal and a supply voltage;
    second transistors coupled in parallel between the first terminal and ground; and a low voltage;
    a feedback loop circuit coupled to the first terminal that generates first calibration codes to control conductive states of the first transistors and second calibration codes to control conductive states of the second transistors,
    wherein the parallel OCT calibration circuit selects one of the first calibration codes and one of the second calibration codes to control a parallel on-chip termination impedance of third and fourth transistors at a pin;
    fifth transistors coupled in parallel between a second terminal and the supply voltage, wherein the first calibration codes control conductive states of the fifth transistors; and
    sixth transistors coupled in parallel between the second terminal and a low voltage, wherein the second calibration codes control conductive states of the sixth transistors.

2. The parallel OCT calibration circuit defined in claim 1 wherein feedback loop circuit comprises a comparator that compares a signal from the first terminal to first and second reference signals, and the feedback loop circuit generates the first and the second calibration codes in response to an output signal of the comparator.

3. The parallel OCT calibration circuit defined in claim 1 wherein feedback loop circuit comprises a comparator that compares a signal from the first terminal to first, second, and third reference signals, and the feedback loop circuit generates the first and the second calibration codes in response to an output signal of the comparator.

4. The parallel OCT calibration circuit defined in claim 3 wherein the parallel OCT calibration circuit selects one of the first calibration codes and one of the second calibration codes that cause a voltage at the first terminal to be within one of a first range defined by the first and the second reference signals and a second range defined by the second and the third reference signals.

5. The parallel OCT calibration circuit defined in claim 1 wherein the feedback loop circuit comprises a first comparator having a first input coupled to receive a signal from the first terminal and a second comparator having a first input coupled to receive a signal from the second terminal.

6. The parallel OCT calibration circuit defined in claim 5 further comprising:
a first multiplexer having inputs coupled to receive a first high voltage, a first medium voltage, and a first low voltage, wherein a second input of the first comparator is coupled to receive an output signal of the first multiplexer; and
a second multiplexer having inputs coupled to receive a second high voltage, a second medium voltage, and a second low voltage, wherein a second input of the second comparator is coupled to receive an output signal of the second multiplexer.

7. The parallel OCT calibration circuit defined in claim 1 wherein the feedback loop circuit further comprises a state machine that selects one of the first calibration codes and one of the second calibration codes that cause a voltage at the first terminal to be in a range defined by a first reference voltage and a second reference voltage and a voltage at the second terminal to be in a range defined by a third reference voltage and a fourth reference voltage.

8. The parallel OCT calibration circuit defined in claim 6 wherein the feedback loop circuit further comprises a state machine that generates first select signals for controlling the first multiplexer and second select signals first controlling the second multiplexer in response to output signals of the first and the second comparators.

9. The parallel OCT calibration circuit defined in claim 1 wherein the feedback loop circuit further comprises a comparator coupled to receive a signal from the first terminal, a state machine coupled to receive an output signal of the comparator, and an adder/subtractor circuit coupled to receive signals from the state machine and generating the first and the second calibration codes.

10. The parallel OCT calibration circuit defined in claim 1 wherein the parallel OCT calibration circuit is part of an integrated circuit that comprises an input buffer coupled to the pin and an output buffer having the third and the fourth transistors, the third and the fourth transistors in the output buffer being driven to provide parallel on-chip termination impedance at the pin when the input buffer is enabled to receive input signals.

11. The parallel OCT calibration circuit defined in claim 10 wherein the integrated circuit is a field programmable gate array.

12. A method for calibrating a parallel on-chip termination impedance, the method comprising:
controlling conductive states of first transistors with first calibration codes, the first transistors being coupled in parallel between a first terminal and a supply voltage;
controlling conductive states of second transistors with second calibration codes, the second transistors being coupled in parallel between the first terminal and a low voltage;
generating the first calibration codes and the second calibration codes using a feedback loop that receives a signal from the first terminal;
selecting one of the first calibration codes and one of the second calibration codes to control a parallel on-chip termination impedance of third and fourth transistors at a pin;
controlling conductive states of fifth transistors with the first calibration codes, the fifth transistors being coupled in parallel between a second terminal and the supply voltage; and
controlling conductive states of sixth transistors with the second calibration codes, the sixth transistors being coupled in parallel between the second terminal and a low voltage.

13. The method defined in claim 12 wherein generating the first calibration codes and the second calibration codes using the feedback loop that receives the signal from the first terminal further comprises comparing the signal from the first terminal with first and second reference voltages using a comparator, and
wherein selecting one of the first calibration codes and one of the second calibration codes to control the parallel on-chip termination impedance of the third and the fourth transistors further comprises selecting a first calibration code and a second calibration code that causes cause a voltage at the first terminal to be in a range defined by the first and the second reference voltages.

14. The method defined in claim 12 wherein generating the first calibration codes and the second calibration codes using the feedback loop that receives the signal from the first terminal further comprises comparing the signal from the first terminal with first, second, and third reference voltages using a comparator, and
wherein selecting one of the first calibration codes and one of the second calibration codes to control the parallel on-chip termination impedance of the third and the fourth transistors further comprises selecting a first calibration code and a second calibration code that cause a voltage at the first terminal to be within one of a first range defined by the first and the second reference voltages and a second range defined by the second and the third reference voltages.

15. The method defined in claim 12 wherein generating the first calibration codes and the second calibration codes using the feedback loop that receives the signal from the first terminal further comprises selecting a voltage signal from among a first, a second, and a third reference voltages, and comparing the selected voltage signal to the signal from the first terminal using a comparator.

16. The method defined in claim 12
wherein generating the first calibration codes and the second calibration codes using the feedback loop that receives the signal from the first terminal further comprises comparing the signal from the first terminal with a first reference voltage using a first comparator and comparing a signal from the second terminal with a second reference voltage using a second comparator.

17. The method defined in claim 16 wherein generating the first calibration codes and the second calibration codes using the feedback loop that receives the signal from the first terminal further comprises adjusting the first and the second calibration codes to generate a voltage at the first terminal that is in a range defined by the first reference voltage and a third reference voltage, and to generate a voltage at the second terminal that is in a range defined by the second reference voltage and a fourth reference voltage.

18. The method defined in claim 16 further comprising:
selecting the first reference voltage from among first, second, and third input voltages using a first multiplexer; and
selecting the second reference voltage from among fourth, fifth, and sixth input voltages using a second multiplexer.

19. An integrated circuit comprising a parallel on-chip termination (OCT) calibration circuit, wherein the parallel OCT calibration circuit comprises:
first transistors coupled in parallel between a first terminal and a supply voltage;
second transistors coupled in parallel between the first terminal and a low voltage;
means for comparing a signal from the first terminal with first and second reference signals;
means for adjusting first calibration codes that control conductive states of the first transistors and second calibration codes that control conductive states of the second transistors until the signal from the first terminal is in a range defined by the first and the second reference signals,
wherein the means for adjusting selects one of the first calibration codes and one of the second calibration codes to control a parallel on-chip termination impedance of third and fourth transistors at a pin of the integrated circuit;
fifth transistors coupled in parallel between a second terminal and a supply voltage, wherein the first calibration codes control conductive states of the fifth transistors; and
sixth transistors coupled in parallel between the second terminal and a low voltage, wherein the second calibration codes control conductive states of the sixth transistors.

20. The integrated circuit defined in claim 19 wherein the integrated circuit comprises an input buffer coupled to the pin and an output buffer having the third and the fourth transistors, the third and the fourth transistors in the output buffer being driven by the selected first and second calibration codes to provide parallel on-chip termination impedance at the pin when the input buffer is enabled to receive input signals.

21. The integrated circuit defined in claim 19 further comprising:
means for comparing a signal from the second terminal with third and fourth reference signals,
and wherein the means for adjusting the first calibration codes and the second calibration codes further comprises means for adjusting the first and the second calibration codes until the signal from the second terminal is in a range defined by the third and the fourth reference signals.

22. A parallel on-chip termination (OCT) calibration circuit comprising:
first transistors coupled in parallel between a first terminal and a supply voltage;
second transistors coupled in parallel between the first terminal and a low voltage; and
a feedback loop circuit that compares a signal from the first terminal to first and second reference signals to generate first calibration codes that control conductive states of the first transistors and second calibration codes that control conductive states of the second transistors,
wherein the parallel OCT calibration circuit selects one of the first calibration codes and one of the second calibration codes to control a parallel on-chip termination impedance of third and fourth transistors at a pin, and wherein the selected first calibration code and the selected second calibration code cause at least one of the third transistors and at least one of the fourth transistors to be on at the same time to generate a Thevenin equivalent impedance.

23. The parallel OCT calibration circuit defined in claim 22 wherein the parallel OCT calibration circuit selects one of the first calibration codes and one of the second calibration codes that cause a voltage at the first terminal to be within one of a first range defined by the first and the second reference signals and a second range defined by the second reference signal and a third reference signal.

* * * * *